(12) United States Patent
Chiang et al.

(10) Patent No.: US 10,497,638 B2
(45) Date of Patent: Dec. 3, 2019

(54) CERAMIC WAFER AND THE MANUFACTURING METHOD THEREOF

(71) Applicant: Hong Chuang Applied Technology Co., Ltd, Zhubei, Hsinchu County (TW)

(72) Inventors: Ruey-Hsia Chiang, Zhubei (TW); Yan-Kai Zeng, Zhubei (TW)

(73) Assignee: HONG CHUANG APPLIED TECHNOLOGY CO., LTD., Zhubei, Hsinchu County (TW)

( * ) Notice: Subject to any disclaimer, the term of this patent is extended or adjusted under 35 U.S.C. 154(b) by 94 days.

(21) Appl. No.: 15/353,057

(22) Filed: Nov. 16, 2016

(65) Prior Publication Data

US 2018/0053706 A1 Feb. 22, 2018

(30) Foreign Application Priority Data

Aug. 17, 2016 (TW) .............................. 105126245 A

(51) Int. Cl.
*B28B 3/02* (2006.01)
*B28B 3/00* (2006.01)
(Continued)

(52) U.S. Cl.
CPC .......... *H01L 23/3731* (2013.01); *B28B 3/003* (2013.01); *B28B 3/006* (2013.01); *B28B 3/02* (2013.01); *B28B 11/08* (2013.01); *B28B 11/14* (2013.01); *C01B 21/0685* (2013.01); *C01B 21/072* (2013.01); *C01B 21/0726* (2013.01); *C01B 21/0765* (2013.01); *C01B 32/97* (2017.08); *C04B 35/48* (2013.01); *C04B 35/486* (2013.01); *C04B 35/573* (2013.01); *C04B 35/575* (2013.01); *C04B 35/581* (2013.01); *C04B 35/6261* (2013.01); *C04B 35/6268* (2013.01); *C04B 35/62675* (2013.01); *C04B 35/62695* (2013.01); *C04B 35/638* (2013.01); *C04B 35/6342* (2013.01); *C04B 35/6365* (2013.01); *C04B 35/63404* (2013.01);
(Continued)

(58) Field of Classification Search
CPC ........ C04B 35/64–35/6455; B28B 3/02–3/086
See application file for complete search history.

(56) References Cited

U.S. PATENT DOCUMENTS 5,314,646 A * 5/1994 Strobel ..................... B28B 3/00
264/13
6,013,236 A * 1/2000 Takahashi ............. C04B 35/575
264/625
(Continued)

*Primary Examiner* — Erin Snelting
(74) *Attorney, Agent, or Firm* — Muncy, Geissler, Olds & Lowe, P.C.

(57) ABSTRACT

A method of producing ceramic wafer includes a forming step and processing step. The processing step includes forming positioning notch or positioning, flat edge and edge profile, which avoids the ceramic wafers to have processing defect during cutting, grinding, and polishing, for increasing yield. The ceramic particles for producing ceramic wafer include nitride ceramic powder, oxide ceramic powder, and nitride ceramic powder. The ceramic wafer has low dielectric constant, insulation, and excellent heat dissipation, which can be applied for the need of semiconductor process, producing electric product and semiconductor equipment.

8 Claims, 5 Drawing Sheets

(51) Int. Cl.

| | | |
|---|---|---|
| C04B 35/64 | (2006.01) | |
| C04B 35/645 | (2006.01) | |
| B28B 11/08 | (2006.01) | |
| B28B 11/14 | (2006.01) | |
| C04B 35/626 | (2006.01) | |
| C04B 35/634 | (2006.01) | |
| C04B 41/91 | (2006.01) | |
| C04B 41/00 | (2006.01) | |
| C04B 41/53 | (2006.01) | |
| C04B 35/01 | (2006.01) | |
| C04B 35/56 | (2006.01) | |
| C04B 35/58 | (2006.01) | |
| H01L 23/373 | (2006.01) | |
| C04B 35/48 | (2006.01) | |
| C04B 35/575 | (2006.01) | |
| C04B 35/581 | (2006.01) | |
| C04B 35/638 | (2006.01) | |
| H01L 21/48 | (2006.01) | |
| C01B 21/072 | (2006.01) | |
| C04B 35/486 | (2006.01) | |
| C04B 35/573 | (2006.01) | |
| C04B 35/636 | (2006.01) | |
| C01B 32/97 | (2017.01) | |
| H01L 23/15 | (2006.01) | |
| C01B 21/068 | (2006.01) | |
| C01B 21/076 | (2006.01) | |
| C04B 111/00 | (2006.01) | |

(52) U.S. Cl.
CPC .......... C04B 35/64 (2013.01); C04B 35/645 (2013.01); C04B 35/6455 (2013.01); C04B 41/009 (2013.01); C04B 41/53 (2013.01); C04B 41/91 (2013.01); H01L 21/4882 (2013.01); H01L 23/15 (2013.01); C04B 2111/00844 (2013.01); C04B 2235/3217 (2013.01); C04B 2235/3225 (2013.01); C04B 2235/3244 (2013.01); C04B 2235/3246 (2013.01); C04B 2235/3418 (2013.01); C04B 2235/3826 (2013.01); C04B 2235/3865 (2013.01); C04B 2235/402 (2013.01); C04B 2235/422 (2013.01); C04B 2235/48 (2013.01); C04B 2235/5436 (2013.01); C04B 2235/604 (2013.01); C04B 2235/6021 (2013.01); C04B 2235/612 (2013.01); C04B 2235/656 (2013.01); C04B 2235/661 (2013.01)

(56) References Cited

U.S. PATENT DOCUMENTS 6,077,149 A * 6/2000 Ohkuni ................ B24B 37/042
  451/285
6,242,709 B1 * 6/2001 Fukuda ................ B23H 7/02
  219/69.12
2007/0241202 A1 * 10/2007 Barker ................ H01L 23/544
  235/494

* cited by examiner

… (1)

CERAMIC WAFER AND THE MANUFACTURING METHOD THEREOF

BACKGROUND OF THE INVENTION

Technical Field

The present invention provides a method of manufacturing a ceramic wafer, in particular, by using the ceramic granule selected from the group consisting of nitride ceramic powder, oxide ceramic powder, and carbide ceramic powder to manufacture the ceramic wafer, which can be applied for the need of semiconductor process, producing electric product and semiconductor equipment.

Semiconductors are indispensable to the electronic industry. Semiconductor manufacturing, also known as wafer processing, entails wafer fabrication, IC design, and masking in the upper reach Industry, as well as IC packaging, testing, package and peripheral lead frame manufacturing, connector manufacturing, and circuit board manufacturing in the lower reach Industry. Wafer fabrication is the beginning stage of semiconductor process and the basis of the semiconductor industry. In a conventional wafer fabrication process, silicon sand undergoes a series of treatments, namely pulling, refining, dissolution, purification, and distillation, to produce a single-crystal silicon ingot, and then the single-crystal silicon ingot is sliced and polished to produce wafers.

Ceramic, which features high rigidity, high melting points, and chemical stability, is widely used in our daily life and applied in the form of tiles and cookware. Recent years see the development of plenty types of "precision ceramic". Unlike conventional ceramic, precision ceramic is a finished product produced from a refined high-purity organic material which undergoes dry pressing, casting, or injection molding while its constituents and uniformity are chemically or physically controlled, and then undergoes sintering. Precision ceramic is rigid and resistant to acids, alkalis, abrasion, compression, and high heat and thereby is widely applicable in the forms, for example, as electronic ceramic, structural ceramic, and biomedical ceramic.

SUMMARY OF THE INVENTION

The inventor of the present invention discovers that ceramic remains stable at high humidity and temperature because of its features, namely a low dielectric constant, excellent insulation, high thermal conductivity, thermal tolerance, and satisfactory capability of heat dissipation. Therefore, ceramic is suitable for making package wafers in semiconductor manufacturing.

In view of the advantage of ceramic wafer mentioned above, the present invention provides a ceramic wafer and the manufacturing method thereof for manufacturing the ceramic wafer for semiconductor process. Further, the manufacturing method also includes forming a locating notch or a locating flat on the ceramic wafer to decrease the defection during the process and increase the yield.

Thus, the first object of the present invention is to provide a method of manufacturing a ceramic wafer, comprising the steps of: (a) molding step: performing pressurized molding on a ceramic granule mechanically or hydraulically in a die operating under a vacuum or normal pressure or in presence of a pressurizing gas, followed by performing isostatic pressing with isotropic hydraulic pressure or pneumatic pressure to produce a ceramic green compact; (b) temperature-controlling step: debinding the ceramic green compact, followed by sintering the debinded ceramic green compact under a normal pressure or high pressure, so as to form a ceramic bulk; (c) grinding step: performing outer diameter grinding on the ceramic bulk to form a precision ceramic bulk; and (d) processing step: forming a locating notch or a locating flat on the precision ceramic bulk, performing multi-wire cutting on the precision ceramic bulk to form wafer slices, grinding flat surfaces and peripheral lead angles of the wafer slice, and polishing the wafer slice to form the ceramic wafer.

Another object of the present invention is to provide a method of manufacturing a ceramic wafer, comprising the steps of: (a) molding step: coupling a ceramic granule to a resin and a dispersing agent, followed by performing a coating process with a scraper, so as to form a ceramic sheet; and (b) processing step: cutting the ceramic sheet into wafer slices according to an outer dimension thereof, processing the wafer slice to form thereon a locating notch or a locating flat, grinding flat surfaces and peripheral lead angles of the wafer slice, and polishing the wafer slice to form the ceramic wafer.

In a preferred embodiment, the ceramic granule is made of one selected from the group consisting of nitride ceramic powder, oxide ceramic powder, and carbide ceramic powder and formed by a pelletizing process.

In a preferred embodiment, mixing a metal oxide or a pure metal powder with an organic polymeric material which contains nitrogen, carbon, and hydrogen atoms, pelletizing the mixture, allowing the mixture to undergo high-temperature carbothermic reduction at a vacuum, normal pressure or pressure in a gaseous atmosphere environment of nitrogen, carbon, and hydrogen atoms, and allowing the mixture to undergo high-temperature decarbonization in an atmospheric environment before being pelletized, so as to form the nitride ceramic powder.

In a preferred embodiment, mixing a metal oxide or a pure metal powder with an organic polymeric material which contains argon, carbon, and hydrogen atoms, pelletizing the mixture, and allowing the mixture to undergo high-temperature carbonization at a vacuum, normal pressure or pressure in a gaseous atmosphere environment of argon, carbon, and hydrogen atoms before being pelletized, so as to form the carbide ceramic powder.

In a preferred embodiment, the oxide ceramic powder is formed by pelletizing a metal oxide or a pure metal powder.

In a preferred embodiment, a sintering-promoting agent and/or a binder and a dispersing agent are introduced during the pelletizing process.

In a preferred embodiment, the pressurized molding performed mechanically or hydraulically takes place at a pressure of 10 ton~1000 ton provided in form of a high-pressure mechanical pressure and at an intra-die pressure of −0.063 atm~100 atm, and the isostatic pressing performed with isotropic hydraulic pressure or pneumatic pressure takes place at an isotropic high pressure of 100 atm~8000 atm and at a temperature of 10° C.~100° C.

In a preferred embodiment, the grinding process is performed in a dry or wet manner and in a unidirectional or bidirectional manner, and the polishing is dry-polishing or wet-polishing and is one-side polishing or double-side polishing.

Another object of the present invention is to provide a ceramic wafer, which is manufactured by the method mentioned above and can be applied to semiconductor process, producing electric product and semiconductor equipment.

A ceramic wafer manufactured by a ceramic wafer manufacturing method of the present invention features a low dielectric constant, excellent insulation, high thermal conductivity, and satisfactory capability of heat dissipation and thereby is suitable for use in semiconductor packaging and electronic product manufacturing. Furthermore, the ceramic wafer exhibits high workability, and thus not only are its dimensions highly precise, but it can also be made multi-layered easily, not to mention that it is always glossy. Hence, the ceramic wafer is unlikely to warp, bend or crack and thereby fit for use with high-precision semiconductor apparatus carriers.

DETAILED DESCRIPTION

Figure 1:
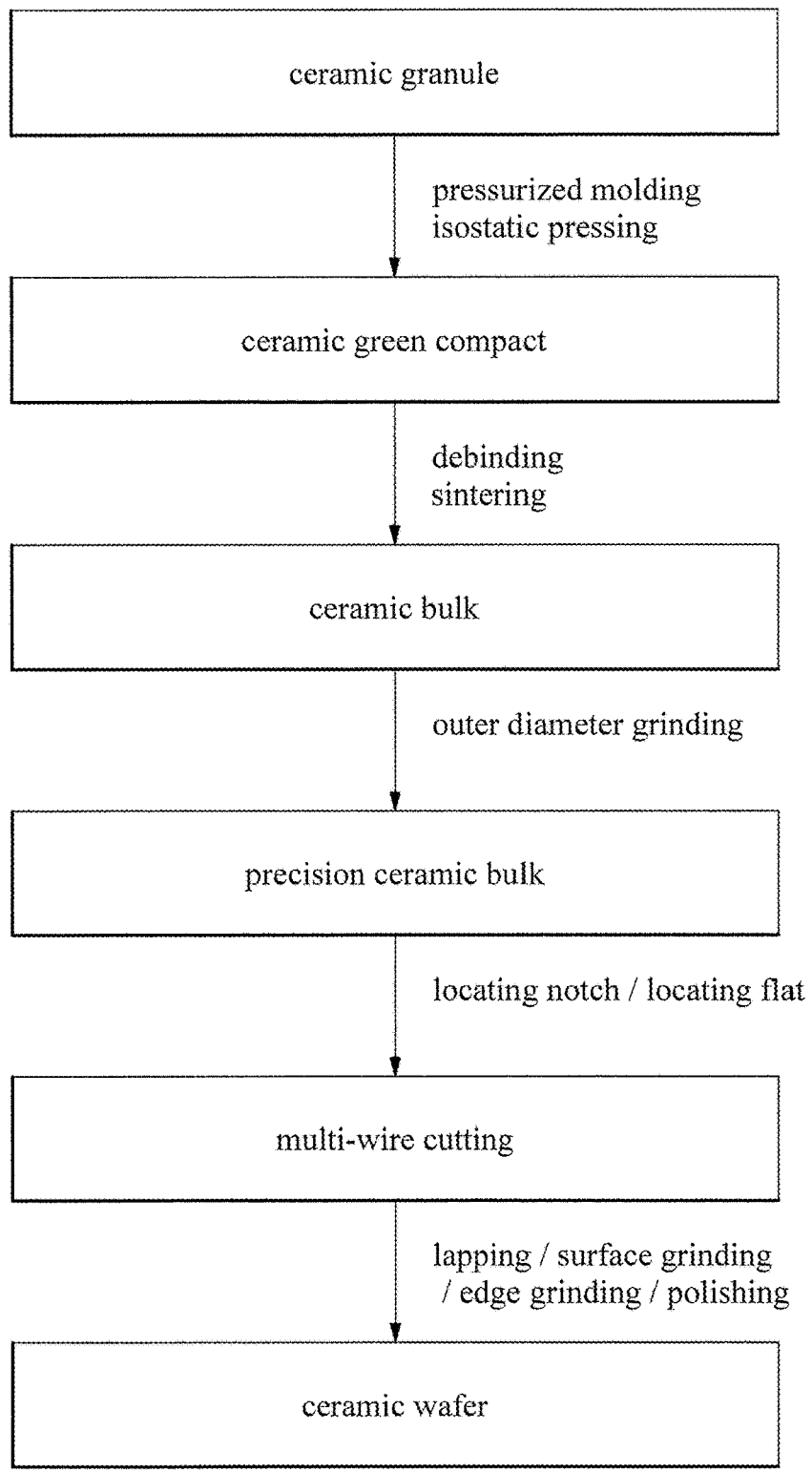
FIG. 1 is the flow chart of the first method of manufacturing a ceramic wafer of the present invention.

Please referring to FIG. 1, the present invention provides a method of manufacturing a ceramic wafer, comprising the steps of: (a) molding step: performing pressurized molding on a ceramic granule mechanically or hydraulically in a die operating under a vacuum or normal pressure or in presence of a pressurizing gas, followed by performing isostatic pressing with isotropic hydraulic pressure or pneumatic pressure to produce a ceramic green compact; (b) temperature-controlling step: debinding the ceramic green compact, followed by sintering the debinded ceramic green compact under a normal pressure or high pressure, so as to form a ceramic bulk; (c) grinding step: performing outer diameter grinding on the ceramic bulk to form a precision ceramic bulk; and (d) processing step: forming a locating notch or a locating flat on the precision ceramic bulk, performing multi-wire cutting on the precision ceramic bulk to form wafer slices, grinding flat surfaces and peripheral lead angles of the wafer slice, and polishing the wafer slice to form the ceramic wafer.

In the (a) molding step, performing pressurized molding on a ceramic granule mechanically or hydraulically in a die operating under a vacuum or normal pressure or in the presence of a pressurizing gas to reduce voids and defects in a green compact to be thus molded, followed by performing isostatic pressing with isotropic hydraulic pressure or pneumatic pressure to render the green density uniform, thereby producing a homogeneous green compact. Further, the pressurized molding takes place at a molding force of 98066.5 N to 9806650 N, such as 98066.5 N, 490332.5 N, 14799.5 N, 1961330 N, 2451662.5 N, 2941995 N, 3432327.5 N, 392260 N, 4412992.5 N, 4903325 N, 5393657.3 N, 5883990 N, 6374322.5 N, 6864655 N, 7354987.5 N, 7845320 N, 833565235 N, 8825985 N, 9316317.5 N, and 9806650 N, and at an intra-die pressure of −0.063 atm ~100 atm, such as −0.063 atm to 100 atm, such as −0.063 atm, 1 atm, 5 atm, 10 atm, 20 atm, 30 atm, 40 atm, 50 atm, 60 atm, 70 atm, 80 atm, 90 atm, and 100 atm. The pressure and temperature for performing isostatic pressing is 100~08000 atm and 10° C.~100° C., respectively; for example, the pressure is 1000 atm, 2000 atm, 3000 atm, 4000 atm, 5000 atm, 6000 atm, 7000 atm, or 8000 atm and the temperature is 10° C., 20° C., 30° C., 40° C., 50° C., 60° C., 70° C., 80° C., 90° C. or 100° C.

In the (b) temperature-controlling step, a debinding process is performed to remove organic matter from the green compact thermally and physically and includes conventional thermal debinding, solvent debinding, catalyzed debinding, and water-based extraction debinding. Preferably, thermal debinding is performed under a temperature of 200° C.~900° C., such as 200° C., 250° C., 300° C., 350° C., 400° C., 450° C., 500° C., 550° C., 600° C., 650° C., 700° C., 750° C., 800° C., 850° C., and 900° C., in an environment of hydrogen, nitrogen, oxygen, argon or air to remove the binder from ceramic granule. The (b) temperature-controlling step further comprises performing a sintering process under a vacuum, normal pressure or high pressure, at a high temperature and in an environment of hydrogen, nitrogen, argon, oxygen, carbon, or air; in an environment of hydrogen, nitrogen, or argon gas when the raw material is nitride ceramic powder, in an environment of air, argon, hydrogen, or oxygen gas when the raw material is oxide ceramic powder, or in an environment of argon, hydrogen, or carbon when the raw material is carbide ceramic powder, wherein the carbon source includes a gas carbon source and a solid carbon source, or in an environment of atmosphere pressure between −0.063 atm and 6000 atm, such as −0.063 atm, 0 atm, 1 atm, 100 atm, 500 atm, 1000 atm, 1500 atm, 2000 atm, 3000 atm, 4000 atm, 5000 atm, and 6000 atm. Further, the high temperature of the sintering process is 1000° C.~3000° C., such as 1000° C., 1200° C., 1500° C., 2000° C., 2500° C. and 3000° C.

In the (c) grinding step, the ceramic bulk is directly processed to be of an outer diameter required for semiconductor apparatus ceramic carriers, wherein the outer diameter of the ceramic bulk varies from semiconductor apparatus to semiconductor apparatus; hence, the ceramic wafer thus manufactured is 18-inch, 12-inch, 10-inch, 8-inch, 6-inch, 4.5-inch, 4-inch or 2-inch round, square or rectangular, or of a special shape and dimensions.

In the (d) processing step, a locating notch or a locating flat is formed by grinding (with mortar or a diamond abrasive disk, for example) or turning. The locating notch or the locating flat enables the ceramic wafer to be more precisely aligned in the semiconductor process, thereby enhancing the yield.

Figure 2:
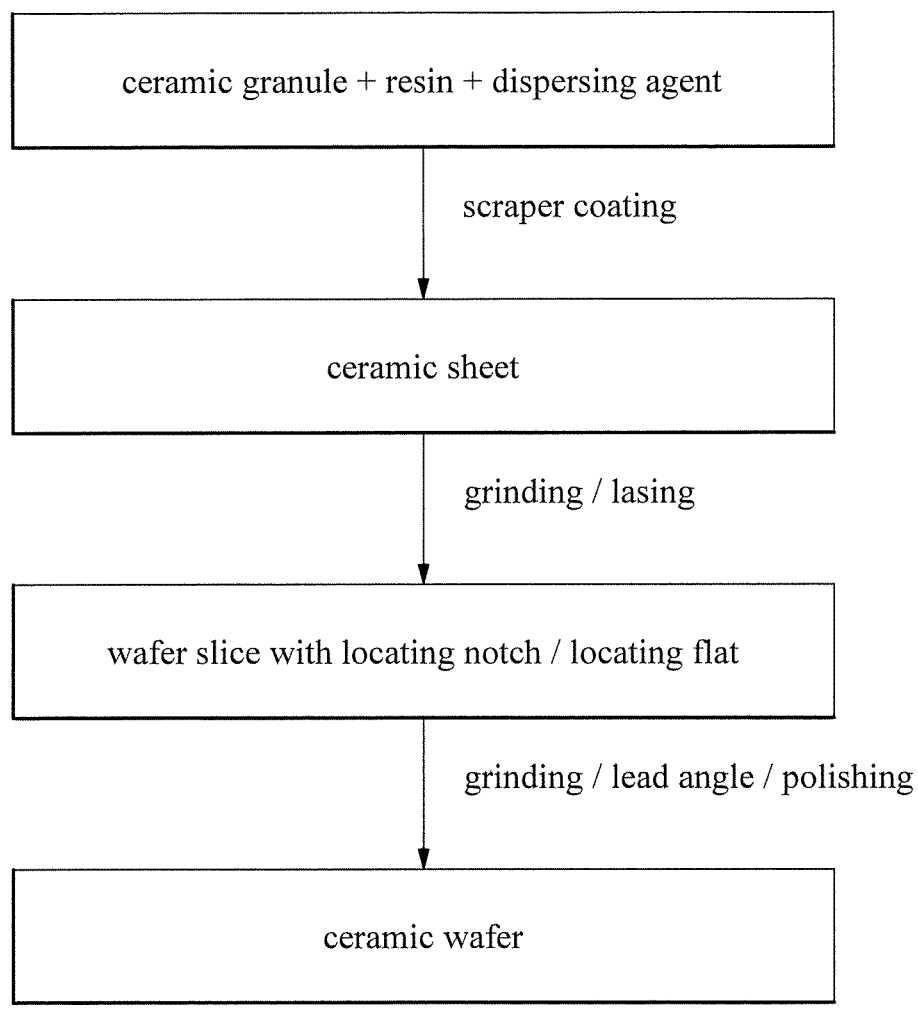
FIG. 2 is the flow chart of the second method of manufacturing a ceramic wafer of the present invention.

Please referring to FIG. 2, another object of the present invention is to provide a method of manufacturing a ceramic wafer, comprising the steps of: (a) molding step: coupling a ceramic granule to a resin and a dispersing agent, followed by performing a coating process with a scraper, so as to form a ceramic sheet; and (b) processing step: cutting the ceramic sheet into wafer slices according to an outer dimension thereof, processing the wafer slice to form thereon a locating notch or a locating flat, grinding flat surfaces and peripheral lead angles of the wafer slice, and polishing the wafer slice to form the ceramic wafer. Further, the ceramic wafer is 18-inch, 12-inch, 10-inch, 8-inch, 6-inch, 4.5-inch, 4-inch or 2-inch round, square or rectangular, or of a special shape and dimensions.

In the (a) molding step, the resin comprises poly(vinyl butyral) (PVB), polyvinyl alcohol (PVA), polyethylene glycol, ethyl cellulose, polyacetone, lower alkyl acrylate copolymer, methylacrylate, or a combination thereof and accounts for 0.1 wt %~10 wt %, such as 0.1 wt %, 1 wt %, 3 wt %, 5 wt %, 7 wt %, or 10 wt %, of the ceramic sheet. The dispersing agent is an organic solvent which comprises: an alcohol, such as methanol, ethanol (95%), n-butanol, pentanol, tolyl ethanol (95%), or diacetone alcohol; a ketone, such as acetone, methyl ethyl ketone, pentanone, methyl isobutyl ketone, or cyclohexanone; an ester, such as methyl acetate, ethyl acetate (85%), butyl acetate, isoamyl acetate, or tributyl phosphate; a carboxylic acid, such as acetic acid; a halogen-substituted hydrocarbon, such as carbon tetrachloride, or dichloropropane; and toluene, 1,4-dioxane, methyl fibrinolytic agent, ethyl fibrinolytic agent, or a combination thereof. Furthermore, the resin further includes a plasticizer for reducing the transition temperature of the resin such that the ceramic wafer exhibits flexibility. The plasticizer comprises dibutyl phthalate, acid salt, phosphate, alcohol ether, monoglyceride, mineral oil, polyester, rosin derivative, Sabah salts, citrates, polyethylene glycol, dioctyl phthalate, fatty acid, polyol, fatty acid ester, citric acid ester, polyester plasticizer, epoxy plasticizer, or a combination thereof. The plasticizer accounts for 0.1 wt %~10 wt %, such as 0.1 wt %, 1 wt %, 3 wt %, 5 wt %, 7 wt %, or 10 wt %, of the ceramic sheet.

In the (b) processing step, a locating notch or a locating flat is formed by grinding (with mortar or a diamond abrasive disk, for example) or turning. The locating notch or the locating flat enables the ceramic wafer to be more precisely aligned in the semiconductor process, thereby enhancing the yield.

The ceramic granule is made of one selected from the group consisting of nitride ceramic powder, oxide ceramic powder, and carbide ceramic powder and made by powder pelletizing. The ceramic granule made by powder pelletizing is of a particle diameter of 30 μm~200 μm, such as 30 μm, 40 μm, 50 μm, 60 μm, 70 μm, 80 μm, 90 μm, 100 μm, 110 μm, 120 μm, 130 μm, 140 μm, 150 μm, 160 μm, 170 μm, 180 μm, 190 μm, 200 μm.

Figure 3:
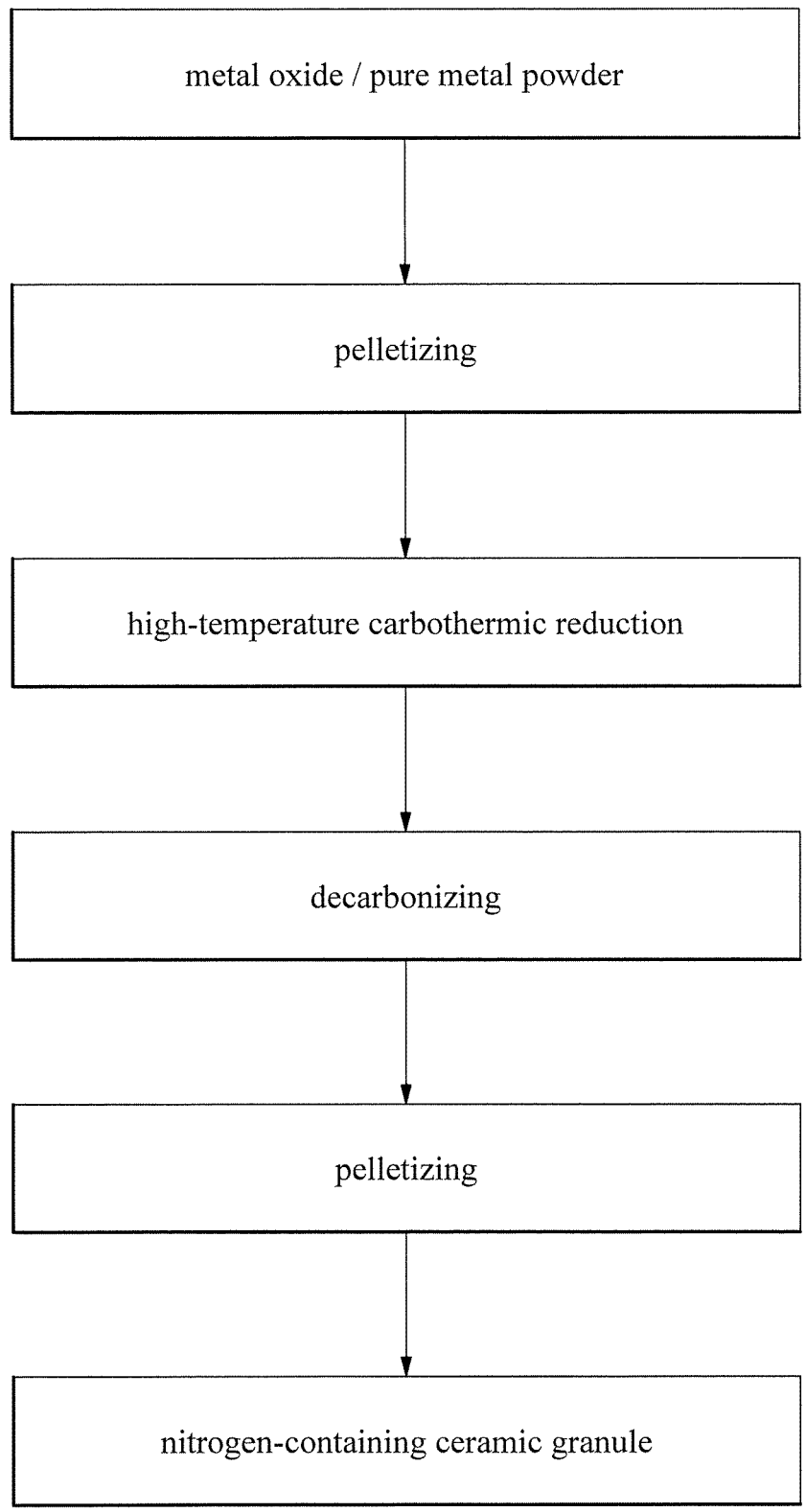
FIG. 3 is the flow chart of the method of forming the nitride ceramic powder.

Please referring to FIG. 3, the nitride ceramic powder mentioned above is manufactured by mixing a metal oxide or a pure metal powder with an organic polymeric material which contains nitrogen, carbon, and hydrogen atoms, pelletizing the mixture, allowing the mixture to undergo high-temperature carbothermic reduction at a vacuum, normal pressure or pressure in a gaseous environment of nitrogen, carbon (wherein the environment is a stationary or rotary environment, whereas the carbon source is solid carbon and gas carbon), and hydrogen atoms, and eventually allowing the mixture to be decarbonized in an atmospheric or oxygen environment (which is a stationary or rotary environment) at a high temperature before being pelletized. The nitrogen-, carbon-, and hydrogen-containing organic polymeric material comprises phenol resin, polyacrylonitrile, ABS resin, butylbenzene rubber, carbon powder, or a combination thereof, preferably phenol resin. Upon completion of the pelletizing process, the high-temperature carbothermic reduction not only produces carbon monoxide or carbon dioxide from oxygen atoms and carbon atoms of a metal oxide, but also produces a metal nitride by replacing the oxygen atoms of the metal oxide with nitrogen atoms, and in consequence the reduction of the metal takes place in a gaseous environment of hydrogen, nitrogen, and carbon, at a pressure of −0.013 atm~6000 atm, and at a high temperature of 600° C.−3000° C., for example, the pressure is −0.013 atm, 0 atm, 1 atm, 100 atm, 500 atm, 1000 atm, 1500 atm, 2000 atm, 3000 atm, 4000 atm, 5000 atm, or 6000 atm and the high temperature is 600° C., 700° C., 800° C., 900° C., 1000° C., 1100° C., 1200° C., 1600° C., 2000° C. or 2000° C. The high-temperature decarbonization removes carbon or carbide which is unnecessary but is otherwise produced in the atomization pelletizing and high-temperature carbothermic reduction processes. The high-temperature decarbonization takes place in a gaseous environment of nitrogen and oxygen and at a temperature of 200° C.~900° C., such as 200° C., 300° C., 400° C., 500° C., 600° C., 700° C., 800° C. and 900° C.

Figure 4:
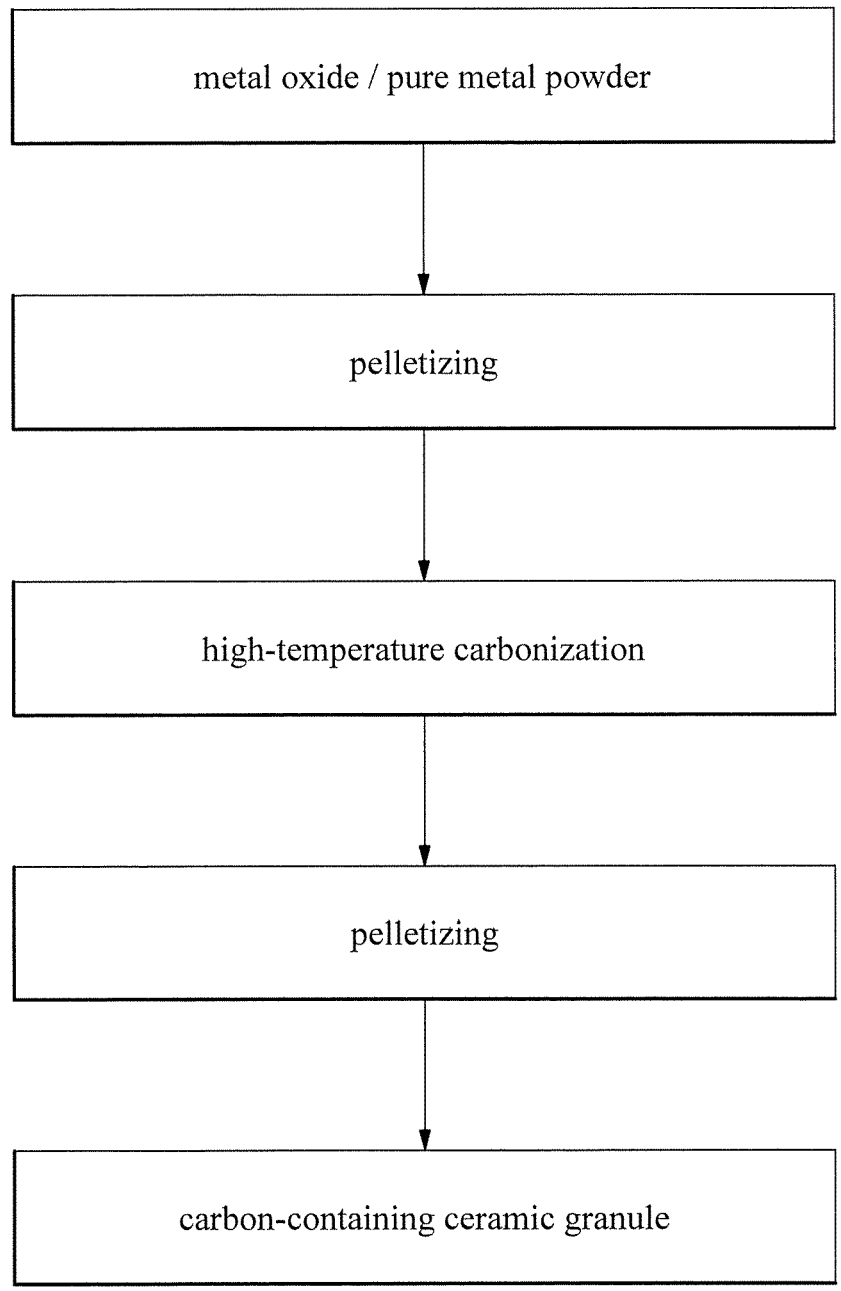
FIG. 4 is the flow chart of the method of forming the carbide ceramic powder.

Please referring to FIG. 4, the carbide ceramic powder mentioned above is manufactured by mixing a metal oxide or a pure metal powder with an organic polymeric material which contains argon, carbon, and hydrogen atoms, pelletizing the mixture, and allowing the mixture to undergo high-temperature carbonization at a vacuum, normal pressure or pressure and in a gaseous atmosphere environment of argon, carbon, and hydrogen atoms before being pelletized, wherein the environment is a stationary or rotary environment. The argon-, carbon-, and hydrogen-containing organic polymeric material comprises phenol resin, polyacrylonitrile, ABS resin, butylbenzene rubber, carbon powder, or a combination thereof, preferably phenol resin. Upon completion of the pelletizing process, the high-temperature carbothermic reduction not only produces carbon monoxide or carbon dioxide from oxygen atoms and carbon atoms of a metal oxide, but also produces a metal nitride by replacing the oxygen atoms of the metal oxide with nitrogen atoms, and in consequence the reduction of the metal takes place in a gaseous atmosphere environment of hydrogen, nitrogen, and carbon, at a pressure of −0.013 atm~6000 atm, and at a high temperature of 600° C.~3000° C., for example, the pressure is −0.013 atm, 0 atm, 1 atm, 100 atm, 500 atm, 1000 atm, 1500 atm, 2000 atm, 3000 atm, 4000 atm, 5000 atm, or 6000 atm and the high temperature is 600° C., 1000° C., 1500° C., 2000° C., 2500° C. or 3000° C.

Figure 5:
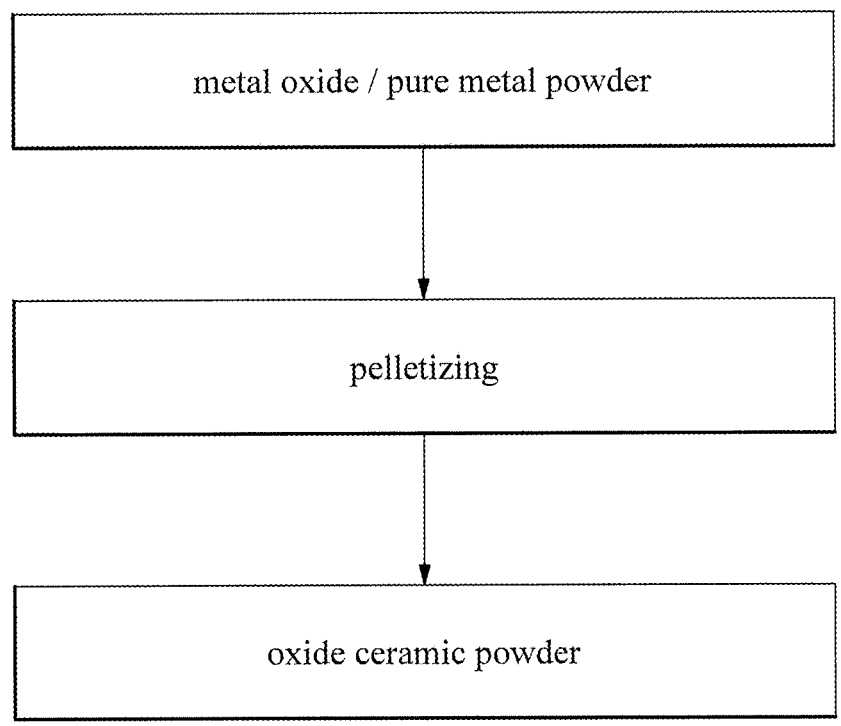
FIG. 5 is the flow chart of the method of forming the oxide ceramic powder.

Please referring to FIG. 5, the oxide ceramic powder is formed by pelletizing a metal oxide or a pure metal powder.

The metal oxide mentioned above is selected from a group consisting of aluminum oxide, calcium oxide, magnesium oxide, zirconium oxide, titanium oxide and yttrium oxide.

The pure metal powder mentioned above is selected from a group consisting of copper, silver, gold, platinum, silver-palladium alloy, aluminum, titanium, chromium, iron, cobalt, nickel, zinc, gallium, platinum, palladium, tungsten, and ruthenium.

The pelletizing process mentioned above entails introducing a sintering-promoting agent and/or a binder, and a dispersing agent. The pelletizing method comprises powder pelletizing, atomization pelletizing, spray pelletizing, stirring rolling/mixing pelletizing, pressurized molding pelletizing, and sintering molding pelletizing, preferably powder pelletizing, atomization pelletizing, and spray pelletizing, and most preferably powder pelletizing. The sintering-promoting agent comprises oxide or nitride, wherein the oxide comprises magnesium oxide, zirconium oxide, calcium oxide, rhenium oxide, yttrium oxide, silicon oxide, boron, carbon, or a combination thereof, and the nitride comprises aluminum nitride, boron nitride, or a combination thereof. The sintering-promoting agent further comprises a metal, such as cerium, europium, erbium, neodymium, terbium, samarium, thulium, dysprosium, yttrium, gadolinium, praseodymium, lutetium, holmium, promethium, lanthanum, or ytterbium. The sintering-promoting agent accounts for 0 wt %~20 wt % of the ceramic powder, such as 0 wt %, 0.5 wt %, 1 wt %, 1.5 wt % and 2 wt %. The binder comprises poly(vinyl butyral) (PVB), polyethylene glycol, gum arabic, ammonium alginate, methyl cellulose, methylene cellulose, ethylene cellulose, ethyl cellulose, methyl ammonium acrylate, methylene bis-(acrylamide), polyoxyethylene, or a combination thereof. The binder accounts for 0.1 wt %~20 wt % of the ceramic powder, such as 0.1 wt %, 1 wt %, 3 wt %, 5 wt %, 7 wt %, 10 wt % and 20 wt %. The dispersing agent comprises polyacrylic acid, polypropylene, polyacrylamide, polyethylene, polyinylidene, polyethylene glycol, gum arabic, gelatin, fish oil, flying fish oil, oleic acid, castor oil, or a combination thereof. The dispersing agent accounts for 0.1 wt %~20 wt % of the ceramic powder, such as 0.1 wt %, 1 wt %, 2 wt %, 3 wt %, 4 wt %, 5 wt %, 10 wt % and 20 wt %.

To perform unidirectional grinding, it is feasible to affix a UV adhesive or hot-melt adhesive or apply a polymeric material to the back of the ceramic wafer, so as to enhance its uniformity.

The ceramic wafer of the present invention has a coefficient of thermal conductivity of 100 W/mk~250 W/mk, such as 100 W/mk, 150 W/mk, 200 W/mk, and 250 W/mk, and a coefficient of thermal expansion of 1~10 ($10^{-6}$/k), such as 1 ($10^{-6}$/k), 3 ($10^{-6}$/k), 5 ($10^{-6}$/k), 8 ($10^{-6}$/k), 10 ($10^{-6}$/k), 13 ($10^{-6}$/k), 15 ($10^{-6}$/k), 18 ($10^{-6}$/k) and 20 ($10^{-6}$/k); hence, it dissipates heat readily but never undergoes thermal expansion. Furthermore, it has a dielectric constant of 1~100 (1 MHz), such as 1 (1 MHz), 3 (1 MHz), 5 (1 MHz), 8 (1 MHz), 10 (1 MHz), 20 (1 MHz), 30 (1 MHz), 40 (1 MHz), 50 (1 MHz), 60 (1 MHz), 70 (1 MHz), 80 (1 MHz), 90 (1 MHz) and 100 (1 MHz), and thus is capable of insulation. Last but not least, it has a bending strength of 100~2000 Mpa, such as 100 Mpa, 250 Mpa, 500 Mpa, 750 Mpa, 1000 Mpa, 1250 Mpa, 1500 Mpa, 1750 Mpa, and 2000 Mpa, and thus exhibits high mechanical strength.

The ceramic wafer manufactured by the ceramic wafer manufacturing method of the present invention is 18-inch, 12-inch, 10-inch, 8-inch, 6-inch, 4.5-inch, 4-inch or 2-inch round, square or rectangular, or of a special shape and dimensions, and is advantageously characterized by excellent insulation, satisfactory capability of heat dissipation, and a low dielectric constant; hence, after undergoing a back-end semiconductor processing process, masking, etching, packaging, and testing, the ceramic wafer can be applied in electronic industry or semiconductor industry to carry out 3D circuit packaging, power semiconductor device packaging, and circuit manufacturing, for example.

EMBODIMENTS

Preparation Example 1—Preparation of Nitride Ceramic Powder 1 kg alumina and 1 kg pure aluminum powder were grinded and mixed with phenol resin and carbon powder and then pelletized. The pellets were placed into a high-temperature furnace under 1 atm at 1600° C. with introduction of acetylene, nitrogen and hydrogen for 20 hr of high-temperature carbothermic reduction. The reduced pellets were placed under atmospheric environment at 600° C. for 24 hr of decarbonization and then ball milled with 20 g yttrium oxide as sintering agent and 50 g poly(vinyl butyral) (PVB) as binding agent, and then pelletized by Okawara Kakohki spray granulator to obtain 1.1 kg of 60~90 μm nitride ceramic powder.

Preparation Example 2—Preparation of Carbide Ceramic Powder 1 kg silica powder and 200 g phenol resin were grinded and mixed with phenol resin and carbon powder and then pelletized. The pellets were placed into a high-temperature furnace under 1 atm at 2000° C. with introduction of hydrogen and argon for 20 hr of high-temperature carbothermic reduction, ball milled with alumina as sintering agent and phenol resin as binding agent, and then pelletized by Okawara Kakohki spray granulator to obtain 1.2 kg of 60~90 μm nitride ceramic powder.

Preparation Example 3—Preparation of Oxide Ceramic Powder 1 kg zirconia powder and 200 g polyvinyl alcohol (PVA) were mixed with 50 g yttrium oxide, grinded and pelletized to obtain 900 g of 60~90 μm nitride ceramic powder.

Example 1—The First Method of Manufacturing Ceramic Wafer of the Present Invention FIG. 1 shows the flow chart of the first method of manufacturing ceramic wafer of the present invention. 1 kg nitride ceramic powder, 1 kg carbide ceramic powder, and 1 kg oxide ceramic powder of preparation example 1 to 3 were used to manufacture different ceramic wafers respectively by a hydraulic machine under a vacuum pressure, at a pressure of 200 ton and an intra-die pressure of −0.03 atm, and then isostatic pressed by a ESPI hydraulic press to produce ceramic green compacts. The ceramic green compacts were debound under the atmosphere environment at 600° C. and sintered under 10 atm at 1800° C., 2100° C., and 1500° C. respectively to form ceramic bulks. The ceramic bulk was placed on a plate to form a locating notch and then performed multi-wire cutting on the ceramic bulk to form 8 inches thin wafer slices. The flat surfaces and peripheral lead angles of the thin wafer slice was ground in a wet and bidirectional manner by a bidirectional grinder and thinned by the thinning machine to the desired size and peripheral lead angles. Lastly, both sides of the thin wafer slice were polished by a single-sided polishing machine to obtain the ceramic wafer.

Example 2—The Second Method of Manufacturing Ceramic Wafer of the Present Invention FIG. 2 shows the flow chart of the second method of manufacturing ceramic wafer of the present invention. 3 kg nitride ceramic powder, 3 kg carbide ceramic powder, and 3 kg oxide ceramic powder of preparation example 1 to 3 were used to manufacture the ceramic wafer respectively by mixing thereof with 10% poly(vinyl butyral) (PVB), 1% dispersant and then using a scraper to form sheets. The sheets were dried at 60° C. for 10 minutes to obtain ceramic sheets. The ceramic sheet was placed at laser machine to form locating notches and laser cut into 8 inches circular thin wafer slice. The flat surfaces and peripheral lead angles of the circular thin wafer slice were ground in a wet and bidirectional manner and thinned by the thinning machine to the desired size and peripheral lead angles. Lastly, both sides of the thin wafer slice were polished by a single-sided polishing machine to obtain the ceramic wafer.

Example 3—Testing the Performance of Ceramic Wafers

The ceramic wafers of Example 1 and 2 and the wafer of the control group were tested for their performances of heat conductivity, bending strength, and dielectric constant. The testing results are shown in Table. 1. Comparing to the wafer of the control group, the ceramic wafers of the present invention have better performance of higher heat conductivity, stronger bending strength, and lower dielectric constant. Thus, the ceramic wafer of the present invention has advantage for being semiconductor wafers.

TABLE 1

|  | Example 1 | Example 2 | Control group |
|---|---|---|---|
| heat conductivity(W/mk) | 181 | 190 | 120 |
| bending strength(Mpa) | 350 | 450 | 150 |
| dielectric constant(1 MHz) | 9 | 9 | 11.9 |

What is claimed is:

1. A method of manufacturing a ceramic wafer, comprising the steps of:
   (a) molding step: performing pressurized molding on a ceramic granule mechanically or hydraulically in a die operating under a pressure of −0.063 to 100 atm or in presence of a pressurizing gas, followed by performing isostatic pressing with isotropic hydraulic pressure or pneumatic pressure to produce a ceramic green compact;
   (b) temperature-controlling step: debinding the ceramic green compact, followed by sintering the debinded ceramic green compact undera pressure of −0.063 to 6000 atm, so as to form a ceramic bulk;
   (c) grinding step: performing outer diameter grinding on the ceramic bulk to form a precision ceramic bulk; and
   (d) processing step: forming a locating notch or a locating flat on the precision ceramic bulk, performing multi-wire cutting on the precision ceramic bulk to form wafer slices, grinding flat surfaces and peripheral lead angles of the wafer slices, and polishing the wafer slices to form the ceramic wafers;
   wherein the debinding in step (b) is performed in an environment of hydrogen, nitrogen, oxygen, argon or air.

2. The method of claim 1, wherein the ceramic granule is made of one selected from the group consisting of nitride ceramic powder, oxide ceramic powder, and carbide ceramic powder and formed by a pelletizing process.

3. The method of claim 2, wherein the nitride ceramic powder is manufactured by mixing a metal oxide or a pure metal powder with an organic polymeric material which contains nitrogen, carbon, and hydrogen atoms; pelletizing the mixture by allowing the mixture to undergo carbothermic reduction at a temperature of 600 to 3000° C. and a pressure of −0.013 to 6000 atm or a pressure in a gaseous environment of nitrogen, carbon, and hydrogen atoms; and then allowing the mixture to undergo decarbonization in a gaseous environment at a temperature of 200 to 900° C.

4. The method of claim 2, wherein the carbide ceramic powder is manufactured by mixing a metal oxide or a pure metal powder with an organic polymeric material which contains argon, carbon, and hydrogen atoms; pelletizing the mixture by allowing the mixture to undergo carbothermic reduction at a temperature of 600 to 3000° C. and a pressure of −0.013 to 6000 atm or a pressure in a gaseous environment of nitrogen, carbon, and hydrogen atoms.

5. The method of claim 2, wherein the oxide ceramic powder is formed by pelletizing a metal oxide.

6. The method of claim 2, wherein (a) sintering-promoting agent or (b) a sintering-promoting agent, a binder and a dispersing agent are introduced during the pelletizing process.

7. The method of claim 1, wherein the pressurized molding performed mechanically or hydraulically takes place at a molding force of 98066.5 N to 9806650 N and at an intra-die pressure of −0.063 atm to 100 atm, and the isostatic pressing performed with isotropic hydraulic pressure or pneumatic pressure takes place at an isotropic high pressure of 100 atm to 8000 atm and at a temperature of 10° C. to 100° C.

8. The method of claim 1, wherein the grinding process in step (d) is performed in a dry or wet manner and in a unidirectional or bidirectional manner, and the polishing is dry-polishing or wet-polishing and is one-side polishing or double-side polishing.

* * * * *